(12) United States Patent
Kim et al.

(10) Patent No.: US 11,355,926 B2
(45) Date of Patent: Jun. 7, 2022

(54) TEST DEVICE

(71) Applicant: SK hynix Inc., Icheon-si (KR)

(72) Inventors: Jin Woo Kim, Icheon-si (KR); Chang Hwi Lee, Seoul (KR); Man Ho Seung, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 272 days.

(21) Appl. No.: 16/659,218

(22) Filed: Oct. 21, 2019

(65) Prior Publication Data

US 2020/0274352 A1 Aug. 27, 2020

(30) Foreign Application Priority Data

Feb. 25, 2019 (KR) .......................... 10-2019-0022007

(51) Int. Cl.
| | | |
|---|---|---|
| *H02H 9/00* | (2006.01) | |
| *H02H 9/04* | (2006.01) | |
| *H01L 27/02* | (2006.01) | |
| *H01L 23/60* | (2006.01) | |
| *H01G 4/40* | (2006.01) | |

(52) U.S. Cl.
CPC .............. *H02H 9/046* (2013.01); *H01G 4/40* (2013.01); *H01L 23/60* (2013.01); *H01L 27/0255* (2013.01); *H01L 27/0266* (2013.01); *H01L 27/0288* (2013.01); *H01L 27/0292* (2013.01)

(58) Field of Classification Search
CPC .. G01R 31/318342; H02H 9/046; H02H 9/00; H01L 27/0266; H01L 27/0255; H01L 23/60; H01L 27/0292
See application file for complete search history.

(56) References Cited

U.S. PATENT DOCUMENTS

| | | | |
|---|---|---|---|
| 2004/0070901 A1* | 4/2004 | Umeda ............... | H01L 27/0266 361/56 |
| 2008/0217650 A1* | 9/2008 | Morishita ........... | H01L 27/0262 257/173 |
| 2010/0118457 A1 | 5/2010 | Kwak | |
| 2013/0161749 A1 | 6/2013 | Kim | |
| 2013/0271883 A1 | 10/2013 | Chang et al. | |
| 2014/0268446 A1 | 9/2014 | Gudem et al. | |
| 2014/0286085 A1* | 9/2014 | Miyakawa ............. | G11C 5/147 365/158 |

FOREIGN PATENT DOCUMENTS

| CN | 101771035 A | 7/2010 |
|---|---|---|
| KR | 1020100129196 A | 12/2010 |

OTHER PUBLICATIONS

Luü Weimin et al., ESD Damage simulation of integrated circuits by the consideration on parasitic parameters, pp. 1100-1104, vol. 37, No. 9, Journal of Beijing University of Aeronautics and Astronautics, Sep. 2011.

* cited by examiner

*Primary Examiner* — Adolf D Berhane
*Assistant Examiner* — Afework S Demisse
(74) *Attorney, Agent, or Firm* — William Park & Associates Ltd.

(57) ABSTRACT

A test device is disclosed. The test device includes an input/output (I/O) circuit configured to allow static electricity flowing between an input/output (I/O) pad and an internal circuit to be discharged to a power-supply line, a ground line, or a substrate line, a capacitor circuit configured to perform modeling of parasitic capacitance extracted from a package design, and a discharge circuit configured to allow capacitance stored in the capacitor circuit to be discharged to the substrate line.

19 Claims, 4 Drawing Sheets

TEST DEVICE

CROSS-REFERENCE TO RELATED APPLICATION

This application claims priority under 35 U.S.C. § 119(a) to Korean patent application No. 10-2019-0022007, filed on Feb. 25, 2019, the disclosure of which is incorporated in its entirety by reference herein.

BACKGROUND

1. Technical Field

Embodiments of the present disclosure may generally relate to a test device, and more particularly to a technology for testing a semiconductor device.

2. Related Art

Generally, electrostatic discharge (ESD) may refer to a specific state indicating that, when at least two electrically-insulated objects are in contact with each other, a current caused by a large difference in voltage between the two objects instantaneously flows in the two objects. Therefore, when a current caused by static electricity flows in an internal circuit of a semiconductor integrated circuit (IC), there is a high possibility of serious damage (for example, destruction of an insulation film, destruction of resistance junction, etc.) in the internal circuit. Therefore, there is needed an electrostatic discharge (ESD) path in which a current caused by static electricity can flow in the internal circuit of the semiconductor IC without destroying the internal circuit of the semiconductor IC.

SUMMARY

In accordance with an embodiment of the present disclosure, a test device may include an input/output (I/O) circuit configured to allow static electricity flowing between an input/output (I/O) pad and an internal circuit to be discharged to a power-supply line, a ground line, or a substrate line, a capacitor circuit configured to perform modeling of parasitic capacitance extracted from a package design, and a discharge circuit configured to allow capacitance stored in the capacitor circuit to be discharged to the substrate line.

In accordance with an embodiment of the present disclosure, a test device may include a parameter extractor configured to design an equivalent circuit by extracting at least one parasitic parameter from a substrate of a package design and each element of the package design, and a modeling circuit configured to generate a simulation signal of a charged device model (CDM) by modeling the parasitic parameter to be matched to the equivalent circuit.

DETAILED DESCRIPTION

Figure 1:
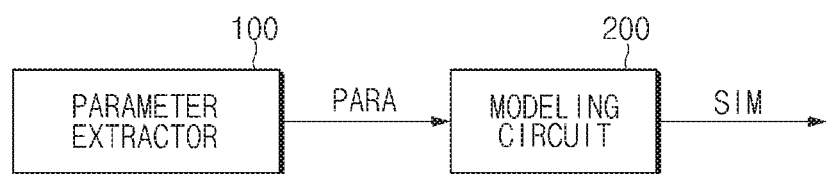
FIG. 1 is a block diagram illustrating a test device according to an embodiment of the present disclosure.

It is to be understood that both the foregoing general description and the following detailed description of the present disclosure are examples and explanatory and are intended to provide further explanation of the disclosure as claimed.

Reference will now be made in detail to embodiments of the present disclosure, examples of which are illustrated in the accompanying drawings. Wherever possible, the same reference numbers are used throughout the drawings to refer to the same or like portions. Throughout the specification of the present disclosure, if it is assumed that a certain part is connected (or coupled) to another part, the term "connection or coupling" means that the certain part is directly connected (or coupled) to another part and/or is electrically connected (or coupled) to another part through the medium of a third party. The word "coupled," as used herein for some embodiments, means that two components are directly connected with one another. For example, a first component coupled to a second component means the first component is contacting the second component. For other embodiments, coupled components have one or more intervening components. For example, a first component is coupled to a second component when the first and second components are both in contact with a common third component even though the first component is not directly contacting the second component. Throughout the specification of the present disclosure, if it is assumed that a certain part includes a certain component, the term "comprising or including" means that a corresponding component may further include other components unless a specific meaning opposed to the corresponding component is written. As used in the specification and appended claims, the terms "a", "an", "one", "the" and other similar terms include both singular and plural forms, unless context clearly dictates otherwise. The terms used in the present application are merely used to describe specific embodiments and are not intended to limit the present disclosure. A singular expression may include a plural expression unless otherwise stated in the context.

Various abnormal modes may occur in the semiconductor device. Especially, there are abnormal modes caused by electrical phenomena, for example, electrical over stress (EOS), an electrostatic discharge (ESD), etc.

ESD may refer to an abnormal mode caused by movement of static electricity, and static electricity based on ESD may be applied to a diode or a transistor of a semiconductor device, such that functions of the diode or transistor of the semiconductor device are destroyed or broken. That is, a high current caused by ESD phenomena is applied to PN Junctions of diodes, junction spiking occurs or a gate insulation film of the transistor is destroyed, such that a gate terminal, a drain terminal, and a source terminal of the transistor are short-circuited and reliability of constituent elements (e.g., diodes, transistors, etc.) of the semiconductor device may be greatly affected by ESD phenomena.

ESD phenomena may be classified into a Human Body Model (HBM), a Machine Model (MM), and a Charged Device Model (CDM) according to reasons of static electricity.

For example, Human Body Model (HBM) may refer to a phenomenon in which static electricity generated from a charged human body is discharged through constituent elements of the semiconductor device such that the constituent elements are destroyed or broken. Machine Model (MM) may refer to a phenomenon in which static electricity generated from a charged machine is instantaneously discharged through constituent elements of the semiconductor device such that the constituent elements are destroyed or broken. Charged Device Model (CDM) may refer to a phenomenon in which static electricity stored in the semiconductor device is simultaneously and instantaneously discharged because the semiconductor device is grounded to an external conductor during a fabrication process of the semiconductor device such that constituent elements of the semiconductor device are destroyed or broken. CDM indicates that constituent elements of the semiconductor device are destroyed or broken by the charged semiconductor device, such that reliability of products may be greatly affected by such CDM. Therefore, many developers and companies of semiconductor devices are conducting intensive research into technology for measuring CDM characteristics through charge discharge modeling, and guaranteeing user-desired CDM characteristics.

Various embodiments of the present disclosure may be directed to providing a test device that substantially addresses one or more issues due to limitations and disadvantages of the related art.

The embodiments of the present disclosure may generally relate to a test device for extracting a parasitic parameter from a package design, and may reflect the extracted parasitic parameter into a modeling process, thereby predicting a charged device model (CDM) stress.

FIG. 1 is a block diagram illustrating a test device 10 according to an embodiment of the present disclosure.

Referring to FIG. 1, the test device 10 may include a parameter extractor 100 and a modeling circuit 200.

Product reliability may be greatly affected by CDM. There is a high possibility of causing defective or faulty products because CDM may unexpectedly occur at any time during a product delivery time from manufacturers to customers. As a result, many defective or faulty products may occur due to occurrence of unexpected CDM. CDM test may be used to recognize and confirm characteristics of a package-coupling structure of the semiconductor devices.

If characteristics of at least one chip are substantially simulated by simulation, there is a difference in size between a package level and a chip layer, such that the amount of resources needed for the simulation may increase and a consumption time becomes longer. Therefore, an extraction process for extracting a package-level parasitic parameter greatly affecting charging and discharging of electricity and a modeling process for modeling a package design to be very similar to an actual product structure are of importance to an embodiment of the present disclosure. Package design refers to actual semiconductor packages that are manufactured in various forms to predict the stress imposed on the device.

For this purpose, the parameter extractor 100 may extract one or more parasitic parameters that are capable of sufficiently coping with various ESD-based phenomena according to various package designs. The parameter extractor 100 may extract at least one parasitic parameter that affects CDM waveforms at a package level, and may thus generate a parameter signal PARA. For example, the parameter extractor 100 may extract capacitance of a substrate of a package design used as a source of CDM stress, and may also extract capacitance of each pin of the package design.

The modeling circuit 200 may generate a simulation signal SIM for CDM by matching NETLIST information to the parameter signal PARA. In other words, the modeling circuit 200 may generate the simulation signal SIM by modeling the parameter signal PARA in which actual measurement of the package design is simulated. For example, a detailed circuit and operation of the modeling circuit 200 will hereinafter be described with reference to the attached drawings.

Therefore, an embodiment of the present disclosure may compare actual measurement information of capacitance extracted from the package design with the simulation result, and may thus confirm simulation consistency according to the result of comparison. That is, how much parasitic capacitance generated in a semiconductor package during assembling of the semiconductor package affects the semiconductor devices can be tested in advance by a system designer or administrator.

When the designed circuit is simulated and the simulated circuit does not operate as intended by the system designer, the designed circuit may also be changed to another circuit design as necessary. As described above, the objective circuit may be simulated in advance, and the system designer may pre-recognize whether the objective circuit normally operates prior to actual fabrication of the objective circuit.

Technology shrink of improving characteristics of semiconductor devices are of importance in terms of engineering aspects. In contrast, technology shrink may reduce a metal width, oxide thickness, etc., and may also increase possibility of danger in terms of electrostatic discharge (ESD).

In addition, some technologies at a package level from among various technologies for improving product characteristics have been researched and developed by many developers and companies. Various package structures may definitely affect CDM stress. Provided that the system designer is able to pre-test vulnerability in CDM stress based on individual package structures, the possibility of causing defective products can be predicted and occurrence of such defective products can be prevented in advance.

Therefore, the test device according to an embodiment of the present disclosure may perform chip-level modeling based on NETLIST information, and may extract various parasitic parameters about the package structures at a package level. As a result, the test device according to an embodiment of the present disclosure may recognize not only noise caused by CDM stress, but also vulnerability predicted at a wafer level, irrespective of package structures.

Figure 2:
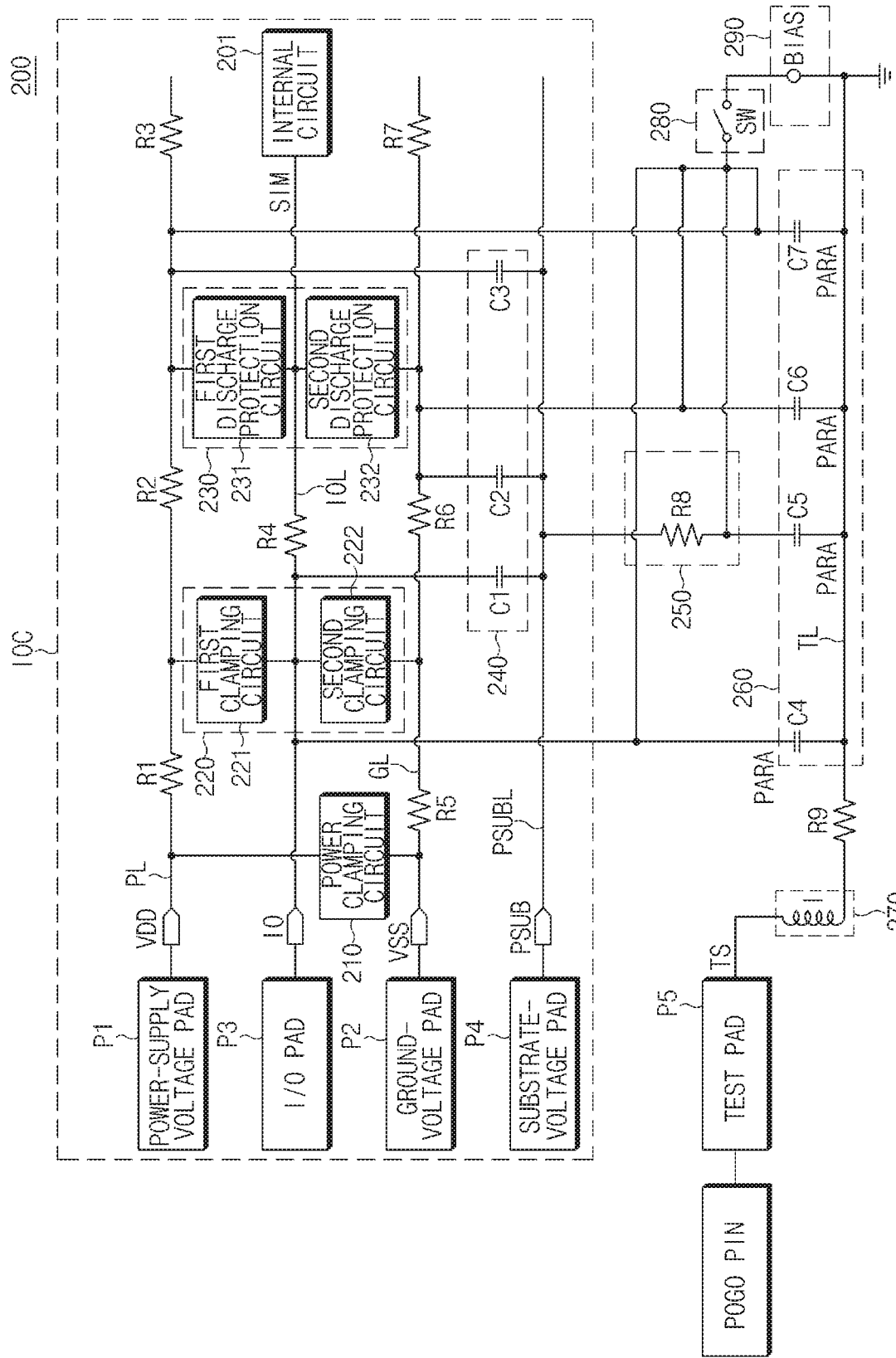
FIG. 2 is a detailed circuit diagram illustrating a modeling circuit shown in FIG. 1.

FIG. 2 is a detailed circuit diagram illustrating the modeling circuit 200 shown in FIG. 1.

Referring to FIG. 2, the modeling circuit 200 may include a power-supply voltage pad P1, a ground-voltage pad P2, an input/output (I/O) pad P3, a substrate-voltage pad P4, a test pad P5, a plurality of resistors R1~R9, a power clamping circuit 210, a local clamping circuit 220, an ESD protection circuit 230, a capacitor circuit 240, a discharge circuit 250, a capacitor circuit 260, an inductance circuit 270, a switching circuit 280, and a bias generation circuit 290.

A specific circuit including the above-mentioned constituent elements (i.e., the power-supply voltage pad P1, the ground-voltage pad P2, the I/O pad P3, the substrate-voltage pad P4, the resistors R1~R7, the power clamping circuit 210, the local clamping circuit 220, the ESD protection circuit 230, and the capacitor circuit 240) may be contained in the modeling circuit 200. For convenience of description, the specific circuit will hereinafter be referred to as an input/output circuit (IOC). In addition, a signal extracted by the input/output circuit (IOC) will hereinafter be referred to as "NETLIST".

The modeling circuit 200 may extract the NETLIST in which elements interconnected in the IOC of the above-mentioned design chip are defined and the connection relationship of the elements is also defined, from the input/output circuit (IOC) of the above design chip. For example, the modeling circuit 200 may extract the NETLIST based on Simulation Program with Integrated Circuit Emphasis (SPICE).

In the integrated circuit (IC) design, various circuit simulation tools may be used. One of the circuit simulation tools may be a program called "SPICE". The modeling circuit 200 may extract the NETLEST from the input/output circuit (IOC) implemented as an integrated circuit (IC) using the SPICE program. In other words, the modeling circuit 200 may extract the NETLIST that includes the ideal connection relationship of elements and parasitic information of the respective elements, at a chip level.

A detailed circuit structure of the modeling circuit 200 will hereinafter be described.

The power-supply voltage pad P1 may receive a power-supply voltage VDD from an external part, and may transmit the received power-supply voltage VDD to a power-supply line PL. The resistors R1~R3 may be coupled to a power-supply line PL.

The ground-voltage pad P2 may receive a ground voltage VSS from the external part, and may transmit the received ground voltage VSS to a ground line GL. The resistors R5~R7 may be coupled to the ground line GL.

The I/O pad P3 may be coupled to external I/O pins, such that the I/O pad P3 may transmit an input/output (I/O) signal IO to an input/output line (IOL). The resistor R4 may be coupled between the I/O pad P3 and the internal circuit 201.

The substrate-voltage pad P4 may transmit a substrate voltage PSUB to a substrate line PSUBL. Because the package design includes a silicon substrate (e.g., a P-type silicon substrate), the substrate voltage PSUB may be applied to the substrate line PSUBL to simulate a parasitic parameter corresponding to the silicon substrate into the modeling process.

The test pad P5 may transmit a test signal TS to a test line TL. For example, the test pad P5 may be a pad coupled to a pogo pin used in a semiconductor package. In an embodiment, the test pad P5 may be used to exchange an electrical signal between a socket board (not shown) and a semiconductor package. The resistor R9 may be coupled to the test line TL.

The power clamping circuit 210 may be used to form a discharge path between two power-supply lines. The power clamping circuit 210 may allow a constant power-supply voltage VDD and a ground voltage VSS to remain unchanged, such that the power clamping circuit 210 may prevent or mitigate charges stored in the internal circuit 201 from being discharged outside, such that the internal circuit 201 is not damaged. The power clamping circuit 210 may be coupled between the power-supply line PL and the ground line GL, such that the power clamping circuit 210 may perform clamping of a power-supply voltage applied to the power-supply line PL and the ground line GL. In an embodiment, the power clamping circuit 210 may be coupled between the power-supply line PL and the ground line GL, and configured to form a discharge path between the power-supply line PL and the ground line GL.

The local clamping circuit 220 may be coupled between the power-supply line PL and the ground line GL, such that the local clamping circuit 220 may perform clamping of a power-supply voltage applied to the input/output line (IOL). The local clamping circuit 220 may include a first clamping circuit 221 and a second clamping circuit 222. In an embodiment, the local clamping circuit 220 may be configured to form a discharge path among the power-supply line PL, the ground line GL, and an input/output (I/O) line IOL.

For example, the first clamping circuit 221 may be coupled between the power-supply line PL and the I/O line (IOL), such that the first clamping circuit 221 may perform clamping of a power-supply voltage applied to the power-supply line and the I/O line (IOL). The second clamping circuit 222 may be coupled between the I/O line (IOL) and the ground line GL, such that the second clamping circuit 222 may perform clamping of a power-supply voltage applied to the I/O line (IOL) and the ground line GL.

The ESD protection circuit 230 may prevent or mitigate static electricity from being discharged to the internal circuit 201 or may prevent or mitigate discharge of static electricity that is discharged outside through the I/O pad P3 from the internal circuit 201. The ESD protection circuit 230 may be coupled between the power-supply line PL and the ground line GL, resulting in formation of an ESD path. Therefore, the ESD protection circuit 230 may allow a current caused by static electricity to flow in the internal circuit 201 without destroying the internal circuit 201. The ESD protection circuit 230 may include a first discharge protection circuit 231 and a second discharge protection circuit 232.

For example, the first discharge protection circuit 231 may be coupled between the power-supply line PL and the I/O line (IOL). Upon receiving static electricity from the I/O pad P3, the first discharge protection circuit 231 may form an ESD path in each of the I/O line (IOL) and the power-supply line PL. The second discharge protection circuit 232 may be coupled between the I/O line (IOL) and the ground line GL. Upon receiving static electricity from the I/O pad P3, the second discharge protection circuit 232 may form an ESD path in the I/O line (IOL) and the ground line GL.

The capacitor circuit 240 may perform modeling of at least one parasitic parameter on the substrate line PSUBL. The capacitor circuit 240 may include a plurality of capacitors C1~C3.

For example, a capacitor C1 may be coupled between the I/O line (IOL) and the substrate line PSUBL. The capacitor C1 may perform modeling of at least one parasitic capacitance of a metal line through which signals are input and output to and from a package die.

A capacitor C2 may be coupled between the ground line GL and the substrate line PSUBL. The capacitor C2 may perform modeling of parasitic capacitance about a ground voltage from among power voltages of the package die.

The capacitor C3 may be coupled between the power-supply line PL and the substrate line PSUBL. The capacitor C3 may perform modeling of a power-supply voltage from among power voltages of the package die.

The discharge circuit 250 may be coupled between the substrate line PSUBL and the capacitor circuit 260. The discharge circuit 250 may include a resistor R8 that is coupled between the capacitor circuit 260 and the substrate line PSUBL. For example, the resistor R8 may be a variable resistor having changeable resistance. Due to the variable resistor R8 having changeable resistance, the discharge circuit 250 may form a discharge path in the direction from the capacitor circuit 260 to the substrate line PSUBL.

In response to the parameter signal PARA extracted from the parameter extractor 100, the capacitor circuit 260 may perform modeling of at least one parasitic parameter generated at a package level. For example, the test line TL may be coupled to the capacitor circuit 260.

In order to perform CDM simulation, the principal parameter of such modeling may be set to capacitance. Various parameters affecting wavelengths of a current and voltage for use in each circuit may be used, for example, RLC {Resistance (R), inductance (L), and capacitance (C)}. Because a duration time needed to extract and verify all parameters increases, capacitance may be set to the principal parameter needed for modeling. Thus, in order to perform modeling of the same condition as in CDM noise generated at a package level, the test device according to an embodiment may arbitrarily simulate one or more parasitic parameters into the modeling using the capacitor circuit 260.

Upon receiving the parameter signal PARA, the capacitor circuit 260 may perform modeling of parasitic components generated from respective elements of the package design using capacitance. The capacitor circuit 260 may include a plurality of capacitors C4~C7, each of which has characteristics similar to those of the actual chip, such that the capacitor circuit 260 may perform modeling of the package design.

For example, the capacitor C4 may be coupled between the I/O line (IOL) and the test line TL. The capacitor C4 may perform modeling of parasitic capacitance of the metal line through which signals are input and output at the package die.

The capacitor C5 may be coupled between the substrate line PSUBL and the test line TL. The capacitor C5 may perform modeling of parasitic capacitance about a substrate voltage of the package die.

The capacitor C6 may be coupled between the ground line GL and the test line TL. The capacitor C6 may perform modeling of parasitic capacitance about a ground voltage from among power voltages of the package die.

The capacitor C7 may be coupled between the power-supply line PL and the test line TL. The capacitor C7 may perform modeling of parasitic capacitance about the power-supply voltage from among power voltages of the package die.

The inductance circuit 270 may be coupled between the test pad P5 and the resistor R9, such that the inductance circuit 270 may perform modeling of one or more inductance parameters. The inductance circuit 270 may include an inductor (I) for modeling an inductance component of the test signal (TS) received from the test pad P5. In response to the test signal (TS), the inductor (I) may perform modeling of one or more inductance components generated in a physical structure of the test device.

The switching circuit 280 may include a switch (SW) for selectively controlling connection between the capacitor circuit 260 and the bias generation circuit 290. The switching circuit 280 may selectively transmit a bias voltage (BIAS) generated from the bias generation circuit 290 to the capacitor circuit 260.

For example, when the switching circuit 280 is closed, the capacitors C4~C7 of the capacitor circuit 260 may be charged by the bias voltage (BIAS). For example, when the switching circuit 280 is opened, a voltage charged by the capacitor circuit 260 may be discharged to the substrate line PSUBL through the resistor R8.

the bias generation circuit 290 may be coupled between the switching circuit 280 and the capacitor circuit 260, resulting in formation of the bias voltage (BIAS) having a Direct Current (DC) level. The bias generation circuit 290 may selectively transmit the bias voltage (BIAS) to the capacitor circuit 260.

As described above, the test device according to an embodiment of the present disclosure may analyze wafer-level vulnerability caused by CDM stress, and may predict the CDM stress irrespective of types and structures of the package design.

Figure 3:
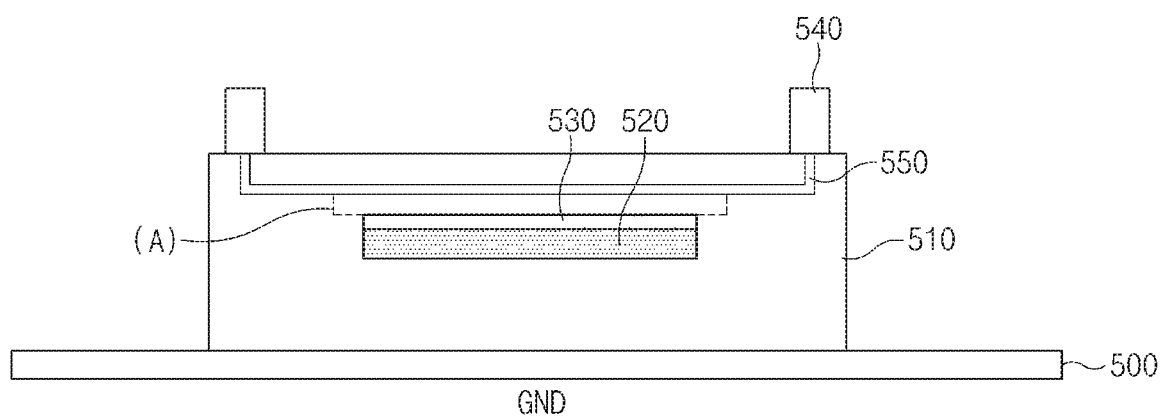
FIG. 3 is a structural view illustrating a parameter extractor shown in FIG. 1.

FIG. 3 is a structural view illustrating the parameter extractor 100 shown in FIG. 1.

In order to perform simulation processing, an example of the package design of the parameter extractor 100 simulated by the modeling circuit 200 is shown in FIG. 3. Referring to FIG. 3, the package design may include a die 520 and a die metal 530 in a package molding 510. For example, the die metal 530 may be electrically coupled to the die 520. A package substrate 550 may be electrically coupled to a package ball 540 through one or more vias. For example, the package substrate 550 may be formed of a silicon substrate. The ground line 500 may be formed at a surface facing the package ball 540.

In order to perform CDM testing, the test device according to an embodiment of the present disclosure may allow the package to be charged with a predefined voltage, such that the test device may extract capacitance from each element of the package. The package design may be changed in various ways, and it may be possible to extract parasitic capacitance from the respective elements using the simulation tool of each package design. Parasitic capacitance extracted from the parameter extractor 100 may be simulated by the design of the modeling circuit 200. The word "predefined" as used herein with respect to a parameter, such as a predefined voltage, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

For example, although the die 520 is present in the package molding 510 during the process of extracting parasitic capacitance from the package design as shown in FIG. 3, a bump and wire needed to interconnect the package substrate 550 and the die metal 530 may be removed as shown in (A) of FIG. 3. Therefore, the die metal 530 and the package substrate 550 may be electrically isolated from each other.

Under the above-mentioned situation, the power-supply voltage may be applied to the parameter extractor 100 through the package ball 540, and the ground voltage may be applied to the parameter extractor 100 through the ground line 500. As a result, the respective elements of the package may be floated, such that parasitic capacitance may occur between the respective elements.

Figure 4:
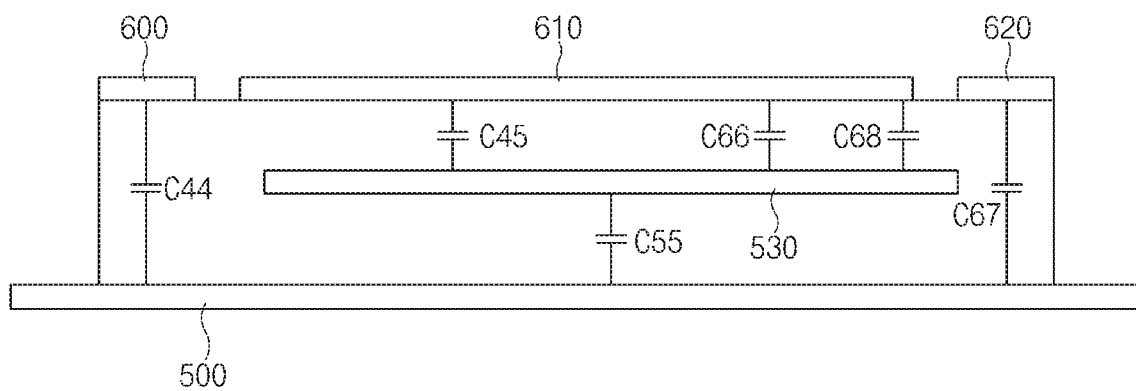
FIG. 4 is a circuit diagram illustrating an equivalent circuit of a package design shown in FIG. 3.

FIG. 4 is a circuit diagram illustrating an equivalent circuit of the package design shown in FIG. 3.

Parasitic capacitance matched to each element of the package design shown in FIG. 3 may be represented by the equivalent circuit shown in FIG. 4. In the equivalent circuit of FIG. 4, metal lines 600, 610, and 620 may be electrically coupled to the package ball 540 of the package design. The equivalent circuit of each parasitic capacitance may be easily changed in various ways according to formats of metal lines of the package design.

In the equivalent circuit, a capacitor C44 may refer to parasitic capacitance that occurs between the metal line 600 and the ground line 500. In the equivalent circuit, a capacitor C45 may refer to parasitic capacitance that occurs between the metal line 610 and the die metal 530. Parasitic capacitance of the capacitors C44 and C45 may be modeled as denoted by the capacitor C4 of FIG. 2.

In the equivalent circuit, a capacitor C55 may refer to parasitic capacitance that occurs between the die metal 530 and the ground line 500. Parasitic capacitance of the capacitor C55 may be modeled as denoted by the capacitor C5 of FIG. 2.

In the equivalent circuit, a capacitor C66 may refer to parasitic capacitance that occurs between the metal line 610 and the die metal 530. In the equivalent circuit, a capacitor C67 may refer to parasitic capacitance that occurs between the metal line 620 and the ground line 500. Parasitic capacitance of the capacitors C66 and C67 may be modeled as denoted by the capacitor C6 of FIG. 2.

In the equivalent circuit, a capacitor C68 may refer to parasitic capacitance that occurs between the metal line 610 and the die metal 530. Parasitic capacitance of the capacitor C68 may be modeled as denoted by the capacitor C7 of FIG. 2.

As described above, the test device according to an embodiment of the present disclosure may extract parasitic capacitance generated from each element of the actual package design using the parameter extractor 100, such that characteristics of the actual package can be simulated by the modeling circuit 200.

As is apparent from the above description, the test device according to an embodiment of the present disclosure may improve accuracy of a charged device model (CDM) waveform, and may predict charged device model (CDM) stress.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A test device comprising:
    an input/output (I/O) circuit configured to allow static electricity flowing between an input/output (I/O) pad and an internal circuit to be discharged to at least one of a power-supply line, a ground line, and a substrate line;
    a capacitor circuit configured to perform modeling of parasitic capacitance extracted a parameter signal; and
    a discharge circuit coupled to the substrate line and the capacitor circuit, the discharge circuit configured to allow capacitance stored in the capacitor circuit to be discharged to the substrate line.

2. The test device according to claim 1, wherein the capacitor circuit performs modeling of the parasitic capacitance to be matched to an equivalent circuit corresponding to the parameter signal.

3. The test device according to claim 1, wherein the capacitor circuit comprises:
    a first capacitor coupled between an input/output line (IOL) coupled to the input/output (I/O) pad and a test line;
    a second capacitor coupled between the substrate line and the test line;
    a third capacitor coupled between the ground line and the test line; and
    a fourth capacitor coupled between the power-supply line and the test line.

4. The test device according to claim 1, wherein the discharge circuit comprises:
    a resistor coupled between the substrate line and the capacitor circuit.

5. The test device according to claim 4, wherein the resistor comprises a variable resistor.

6. The test device according to claim 1, further comprising:
    a test pad configured to receive a test signal as an input; and
    an inductance circuit coupled between the test pad and the capacitor circuit, and configured to perform modeling of an inductance parameter.

7. The test device according to claim 6, further comprising:
    a resistor coupled between the inductance circuit and the capacitor circuit.

8. The test device according to claim 1, wherein the test pad is coupled to a pogo pin of a semiconductor package.

9. The test device according to claim 1, further comprising:
    a bias generation circuit configured to supply a bias voltage to the capacitor circuit; and
    a switching circuit configured to selectively control connection between the capacitor circuit and the bias generation circuit.

10. The test device according to claim 9, wherein the bias voltage has a direct current (DC) level.

11. The test device according to claim 9, wherein:
    when the switching circuit is closed, the capacitor circuit is charged by the bias voltage; and
    when the switching circuit is opened, a voltage stored in the capacitor circuit is discharged to the substrate line through a resistor circuit.

12. The test device according to claim 1, wherein the input/output (I/O) circuit comprises:
    a power clamping circuit coupled between the power-supply line and the ground line, and configured to form a discharge path between the power-supply line and the ground line;
    a local clamping circuit configured to form a discharge path among the power-supply line, the ground line, and an input/output (I/O) line; and
    an electrostatic discharge (ESD) protection circuit coupled between the power-supply line and the ground line, and configured to form a electrostatic discharge (ESD) path.

13. The test device according to claim 12, wherein the input/output (I/O) circuit further comprises:
    a power-supply voltage pad configured to supply a power-supply voltage to the power-supply line;
    a ground-voltage pad configured to supply a ground voltage to the ground line;
    the input/output (I/O) pad configured to supply an input/output (I/O) signal to the substrate line; and
    a substrate-voltage pad configured to supply a substrate voltage to the substrate line.

14. The test device according to claim 13,
wherein the power supply line comprises a resistor;
wherein the input/output (I/O) line comprises a resistor; and
wherein the ground line comprises a resistor.

15. A test device comprising:
a parameter extractor configured to design an equivalent circuit by extracting at least one parasitic parameter from a substrate of a package design and each of constituent elements of the package design; and
a modeling circuit configured to generate a simulation signal of a charged device model (CDM) by modeling the parasitic parameter to be matched to the equivalent circuit,
wherein the modeling circuit comprises:
an input/output (I/O) circuit configured to allow static electricity flowing between an input/output (I/O) pad and an internal circuit to be discharged to at least one of a power-supply line, a ground line, or a substrate line;
a capacitor circuit configured to perform modeling of parasitic capacitance extracted from the package design; and
a discharge circuit coupled to the substrate line and the capacitor circuit, the discharge circuit configured to allow the capacitor circuit to be discharged to the substrate line.

16. The test device according to claim 15, wherein the package design comprises:
a die contained in a package molding;
a die metal electrically coupled to the die;
a package substrate electrically isolated from the die metal;
a package ball electrically coupled to the package substrate; and
a ground line formed at a surface of the package molding facing the package ball.

17. The test device according to claim 16, wherein the parameter extractor is configured to extract parasitic capacitance from each of the constituent elements by supplying a predefined voltage to the package design.

18. The test device according to claim 15, wherein the capacitor circuit comprises:
a first capacitor coupled between an input/output line (IOL) coupled to the input/output (I/O) pad and a test line;
a second capacitor coupled between the substrate line and the test line;
a third capacitor coupled between the ground line and the test line; and
a fourth capacitor coupled between the power-supply line and the test line.

19. The test device according to claim 15, wherein the discharge circuit comprises:
a resistor coupled between the substrate line and the capacitor circuit.

* * * * *